US010698275B2

(12) United States Patent
Wang et al.

(10) Patent No.: US 10,698,275 B2
(45) Date of Patent: Jun. 30, 2020

(54) DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Qian Wang, Beijing (CN); Xiaochuan Chen, Beijing (CN); Wenqing Zhao, Beijing (CN); Rui Xu, Beijing (CN); Lei Wang, Beijing (CN); Ming Yang, Beijing (CN); Pengcheng Lu, Beijing (CN); Jian Gao, Beijing (CN); Xiaochen Niu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/535,957

(22) PCT Filed: Oct. 24, 2016

(86) PCT No.: PCT/CN2016/102994
§ 371 (c)(1),
(2) Date: Jun. 14, 2017

(87) PCT Pub. No.: WO2017/177654
PCT Pub. Date: Oct. 19, 2017

(65) Prior Publication Data
US 2018/0203271 A1 Jul. 19, 2018

(30) Foreign Application Priority Data

Apr. 11, 2016 (CN) .......................... 2016 1 0222194

(51) Int. Cl.
G02F 1/1347 (2006.01)
G02F 1/29 (2006.01)
(Continued)

(52) U.S. Cl.
CPC .......... *G02F 1/1347* (2013.01); *G02F 1/1393* (2013.01); *G02F 1/133504* (2013.01);
(Continued)

(58) Field of Classification Search
CPC ............ G02F 1/1347; G02F 1/133504; G02F 1/1393; G02F 1/133528; G02F 2001/133548; H01L 27/3232
See application file for complete search history.

(56) References Cited

U.S. PATENT DOCUMENTS

2005/0041174 A1    2/2005  Numata et al.
2006/0291243 A1   12/2006  Niioka et al.
(Continued)

FOREIGN PATENT DOCUMENTS

CN        1667464 A     9/2005
CN      101883947 A    11/2010
(Continued)

OTHER PUBLICATIONS

International Search Report and Written Opinion dated Dec. 29, 2016; PCT/CN2016/102994.

*Primary Examiner* — Nathanael R Briggs

(57) ABSTRACT

A display apparatus is provided. The display apparatus includes a flat display panel; a light deflector, the light deflector being located in a light emergent direction of the display panel, the light deflector being configured to converge light emitted from the display panel in a direction toward a center plane, the center plane being perpendicular to the display panel, and a vertical center line of the display panel being located in the center plane.

5 Claims, 8 Drawing Sheets

(51) Int. Cl.
  *G02F 1/1335* (2006.01)
  *G02F 1/139* (2006.01)
  *H01L 27/32* (2006.01)
(52) U.S. Cl.
  CPC ............ *G02F 1/29* (2013.01); *H01L 27/3232* (2013.01); *G02F 1/133528* (2013.01); *G02F 2001/133548* (2013.01); *G02F 2001/294* (2013.01); *G02F 2201/44* (2013.01)

(56) References Cited

U.S. PATENT DOCUMENTS

| | | | | |
|---|---|---|---|---|
| 2009/0046362 | A1* | 2/2009 | Guo | B82Y 10/00 |
| | | | | 359/485.05 |
| 2010/0238648 | A1 | 9/2010 | Tsukahara | |
| 2011/0176312 | A1* | 7/2011 | Mimura | B29D 11/0074 |
| | | | | 362/311.01 |
| 2013/0329164 | A1* | 12/2013 | Jang | G02F 1/1335 |
| | | | | 349/64 |
| 2014/0085570 | A1* | 3/2014 | Kuwata | G02B 6/0053 |
| | | | | 349/65 |
| 2014/0176835 | A1* | 6/2014 | Hayashi | G02F 1/133504 |
| | | | | 349/15 |
| 2015/0036068 | A1* | 2/2015 | Fattal | G02B 6/0036 |
| | | | | 349/15 |
| 2016/0195646 | A1 | 7/2016 | Su et al. | |

FOREIGN PATENT DOCUMENTS

| | | |
|---|---|---|
| CN | 103562618 A | 2/2014 |
| CN | 104464523 A | 3/2015 |
| CN | 105469715 A | 4/2016 |
| CN | 105629622 A | 6/2016 |
| CN | 105652511 A | 6/2016 |
| CN | 105700269 A | 6/2016 |
| JP | 07-318729 A | 12/1995 |

* cited by examiner

DISPLAY APPARATUS

TECHNICAL FIELD

Embodiments of the present disclosure relate to a display apparatus.

BACKGROUND

A display in the prior art is mostly a flat panel display. As illustrated in FIG. 1, assuming that a viewer watches a program right in front of the flat panel display, a distance (L1) between the viewer and a center of a screen is unequal to a distance (L2) between the viewer and both sides the screen, so that when the viewer is watching, image brightness presented on both sides of the screen is incident into human eyes in an inclination direction (i.e., a direction which is not perpendicular to the screen of the display). Generally, in this case, the viewer can receive peak brightness emitted from the center of the screen, but cannot receive peak brightness emitted from both sides of the screen and only receives relatively weak brightness from both sides of the screen so as to cause a case of generating inconsistent viewing effects when the viewer views the center of the screen and both sides of the screen. Generally, for a large-sized flat display, this problem will be more obvious.

In order to solve the problem, a curved surface display emerges at the right moment. Specifically, as illustrated in FIG. 2, the curved surface display has a curved surface screen obtained by physical bending. As illustrated in FIG. 3, when the viewer is at the optimal viewing position, a distance (L1) between the viewer and a center of a screen is equal to a distance (L1) between the viewer and both sides of the screen, and at the moment, whether on the center of the screen or on both sides of the screen, emitted peak brightness directly faces the viewer, so that the viewer can enjoy an equidistant surrounding viewing effect.

However, the curved surface display needs to carry out physical bending on the screen, which requires a high bendability of the material and is more difficult to achieve in the process.

SUMMARY

An embodiment of the disclosure provides a display apparatus, comprising: a flat display panel; a light deflector, the light deflector being located in a light emergent direction of the display panel, the light deflector being configured to converge light emitted from the display panel in a direction toward a center plane, the center plane being perpendicular to the display panel, and a vertical center line of the display panel being located in the center plane.

Optionally, the display panel includes: a first substrate and a second substrate provided opposite to and parallel to each other, the second substrate being closer to the light deflector with respect to the first substrate; a light correction portion, the light correction portion being carried by the first substrate or the second substrate, and the light correction portion being configured to correct incident light into emergent light perpendicular to the display panel.

Optionally, the display panel is a passive display panel, and the display apparatus further comprises: a backlight module; the backlight module including: a light source, and a light correction portion located in a light emergent direction of the light source, and the light correction portion being configured to correct incident light into emergent light perpendicular to the display panel.

Optionally, the backlight module further includes: a light guide plate, the light source being located on a side surface of the light guide plate, and the light correction portion being located in a light emergent direction of the light guide plate, the light guide plate having a light extract groove on a surface thereof close to the light correction portion; light emitted from the light source is totally reflected in the light guide plate, and among light that is totally reflected, light with a specific incident angle is emitted from the light extract groove, and enters the light correction portion.

Optionally, the light correction portion includes: a diffraction grating, the diffraction grating having a grating surface and a groove surface, the groove surface including a plurality of sub-groove surfaces, and the respective sub-groove surfaces being provided obliquely, the grating surface being a light incident surface, and the groove surface being a light emergent surface; a first dielectric layer, the first dielectric layer being located on the groove surface of the diffraction grating, and light emitted from the diffraction grating being refracted by the light emergent surface of the first dielectric layer, changed into emergent light perpendicular to the display panel.

Optionally, the light correction portion further includes: a second dielectric layer, the second dielectric layer being located on the light emergent surface of the first dielectric layer, and a light emergent surface of the second dielectric layer being parallel to the display panel.

Optionally, the respective sub-groove surfaces are arranged in parallel, and the light emergent surface of the first dielectric layer is one inclined plane or includes a plurality of parallel refractive sub-surfaces.

Optionally, the sub-groove surface and the light emergent surface of the first dielectric layer are inclined towards opposite directions.

Optionally, the light correction portion includes: a diffraction grating, the diffraction grating having a grating surface and a groove surface, the groove surface including a plurality of sub-groove surfaces, the sub-groove surfaces being parallel to the display panel, the grating surface being a light incident surface, and the groove surface being a light emergent surface.

Optionally, the light correction portion further includes: a first dielectric layer, the diffraction grating being located on the first dielectric layer, and the grating surface of the diffraction grating being bonded to the first dielectric layer.

Optionally, the light correction portion further includes: a second dielectric layer, the second dielectric layer being located on the groove surface of the diffraction grating, and a light emergent surface of the second dielectric layer being parallel to the display panel.

Optionally, the diffraction grating includes groove portions arranged periodically, the groove portion within each period including: groove groups arranged sequentially, the numbers of groove portions included in the respective groove groups being the same, shapes of groove portions within a same groove group being the same, and shapes of groove portions in different groove groups being different.

Optionally, the light correction portion is provided between the first substrate and the second substrate.

Optionally, the display panel further includes: a metal wire grid polarizer provided on the first substrate.

Optionally, the metal wire grid polarizer is provided on a side of the first substrate facing the second substrate.

Optionally, the light deflector is configured to not deflect light emitted from the display panel in a direction parallel to the vertical center line.

Optionally, the light deflector includes a liquid crystal lens, the liquid crystal lens including a first electrode and a second electrode provided opposite to each other, and a liquid crystal layer sandwiched between the first electrode and the second electrode.

Optionally, at least one of the first electrode and the second electrode includes a plurality of strip sub-electrodes arranged parallel to each other at intervals, and the strip sub-electrodes extending in a direction parallel to the vertical center line.

A display apparatus provided by an embodiment of the present disclosure, comprising a display panel, and a light deflector which is capable of converging light emitted from the display panel toward a direction of a center plane, so that without bending the display panel, a curved surface display effect can be achieved by additionally providing the light deflector. Since the display panel is flat and does not require physical bending, it is possible to overcome the problem in the prior art that the curved surface display requires a high bendability of a material and is more difficult to achieve in the process.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An implementation principle of embodiments of the present disclosure rests with that: through cooperation of a flat display panel (which may also be referred to as a display screen) and a light deflector, and specifically, by the display panel which emits light, the light deflector may deflect light toward a viewing azimuth of a viewer, so that a curved surface display effect is basically achieved.

Hereinafter, specific embodiments will be provided based on the above-described implementation principle.

Embodiment One

Figure 4A:
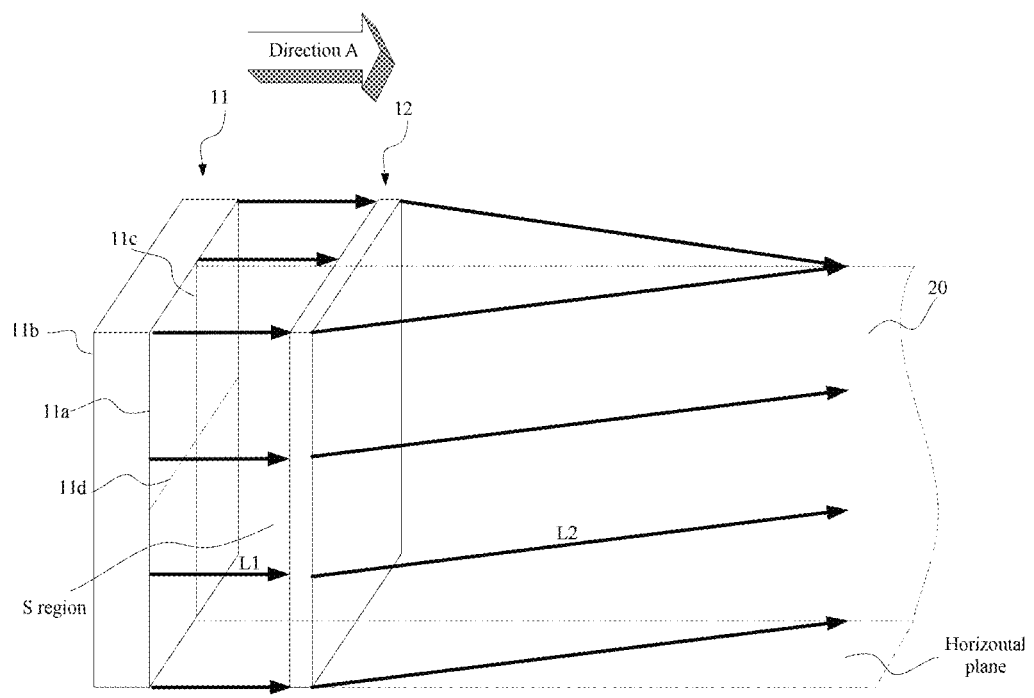
FIG. 4A is an optical path diagram of a display apparatus provided by an embodiment of the present disclosure.
Figure 4B:
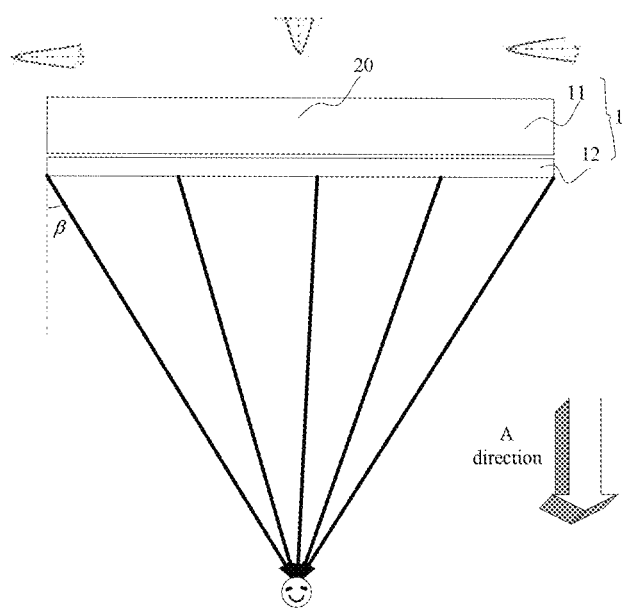
FIG. 4B is a schematic diagram of viewing the display apparatus illustrated in FIG. 4, which is provided by the embodiment of the present disclosure.

As illustrated in FIG. 4A and FIG. 4B, an embodiment of the present disclosure provides a display apparatus 1, comprising: a flat display panel 11 and a light deflector 12.

A reason why the display panel 11 is referred to have a flat shape is to distinguish it from a curved surface display screen, and indicate that two surfaces (i.e., a display surface 11a and a back surface 11b opposite to the display panel) of the display panel 11 in this embodiment are both planes and are nearly in parallel generally.

For example, in the embodiment, a light emergent direction of the display panel 11 is perpendicular to the display panel. For example, since the display panel in the present application is a flat display panel, being perpendicular to or parallel to the display panel indicates being perpendicular to or parallel to a main surface (or a display surface) of the display panel. That is to say, light emitted from the display panel 11 is emitted from the display surface 11a, mainly in a direction perpendicular to the display panel (a direction A in the diagram). A reason why "mainly" is emphasized, is that there is usually an error between a fact and a theory, and in this embodiment, it is desirable that light emitted from the display panel 11 is all perpendicular to the display panel, and here it meets the requirement as long as light of a predetermined wavelength band (for example, red light, green light, blue light) can be mostly emitted perpendicular to the display panel. In this embodiment, the type of light is referred to as vertical light. Usually, a display panel in the prior art has a certain viewing angle, and here the vertical light indicates that with respect to the display panel in the prior art, the display panel according to this embodiment has a smaller viewing angle with respect to the display panel in the prior art, and in general, the smaller the viewing angle, the better; and if all light is emitted perpendicularly to the display panel, the viewing angle is 0 degree.

As described more specifically, it is assumed that the viewer is in front of the display panel, ideally, light emitted from the display panel may be incident into human eyes only when the human eyes are located within an S region (a three-dimensional space formed in a mode that a plane region of the display surface of the display panel extends in the direction perpendicular to the display panel), and at this time, the viewer can see a picture presented by the display panel; and if the human eyes are located in a region outside the S region, it is impossible to see the picture. A conventional display panel is usually expected to have a large viewing angle; however, it is desirable in this embodiment that the viewing angle of the display panel is preferably as small as possible, and most preferably, the viewing angle is 0 degree.

The display panel 11 may be an active display panel, which may be self-luminous; and it may also be a passive display panel, which typically depends on a backlight module to provide backlight. In embodiments below, for different types of display panels, it will be described in detail how to make the display panel emit the vertical light.

It should be noted that in this embodiment, it is also possible that the light emitted by the display panel 11 is not the vertical light; however, if the display panel 11 can emit the vertical light, the effect will be better after the vertical light is converged.

In addition, as illustrated in FIG. 4A and FIG. 4B, the light deflector 12 is located in the light emergent direction of the display panel 11. Exemplarily, the light deflector 12 may be clung to the display surface of the display panel 11, and in the diagram, in order to clearly express transmission of the light, the display panel 11 and the deflector 12 are separately drawn. The light deflector 12 is used for converging light emitted from the display panel 11 toward a direction of a center plane 20, and the center plane 20 is a plane which is perpendicular to the display panel 11 and passes through a vertical center line 11c of the display panel. That is to say, the vertical center line 11c of the display panel is located within the center plane 20. What is perpendicular to the vertical center line 11c is a transverse center line 11d of the display panel, so as to distinguish the two center lines of the display panel. In this embodiment, the transverse center line 11d refers to a center line which is approximately parallel to a connection line between two eyes of the viewer when the display panel is placed in a mode that the display panel is normally viewed, so that the vertical center line lie is clear. That is to say, the vertical center line 11c is a center line perpendicular to a connection line between two eyes of the viewer when the display panel is placed in a normally viewed manner.

The display apparatus including the light deflector 12 and the display panel 11 may be used as a novel display panel, i.e., a flat display panel capable of being used for showing a curved surface display effect.

It should be noted that those skilled in the art should understand that: light emitted from the display panel 11 converges toward the direction of the center plane 20 just for enabling light emerging from both sides of the center plane to be deflected towards the direction of the center plane 20; and in an ideal state, it is not expected to change a height of light. For example, a light ray L1 emitted from the display panel 11, is parallel to a horizontal plane where the display panel is placed, then the light ray L1 passes through the light deflector 12, resulting in a light ray L2, and the light ray L2 is also parallel to the horizontal plane, and a height of L1 from the horizontal plane is equal to a height of L2 from the horizontal plane. That is to say, the light deflector is configured to not deflect light emitted from the display panel in a direction parallel to the vertical center line.

It should be noted that, in theory, it is most preferable that all light emitted is converged to the center plane 20, and at this time, a position of convergence may be taken as a best viewing position. In practice, however, in this embodiment, it is not required that all light emitted is converged to the center plane 20, but it is only required that after light passes through the light deflector 12, its transmission direction is deflected toward the direction of the center plane, as compared with that before light passes through the light deflector 12.

It can be known from the analysis above that the light deflector 12 takes an effect of changing the transmission direction of the vertical light for example, and then there are many devices capable of taking this effect. For example: the light deflector 12 may be a convex lens, a prism, a liquid crystal lens, and the like that can achieve the above-described effect, generally, a size of the light deflector 12 is substantially the same as that of the display panel.

Figure 1:
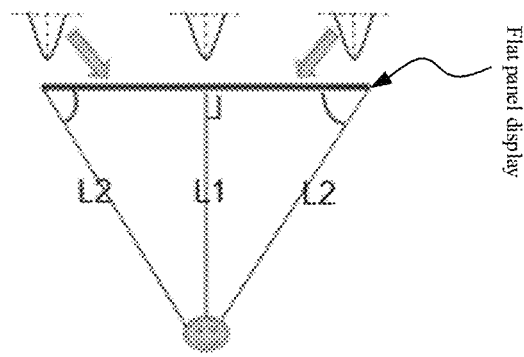
FIG. 1 is a schematic diagram of viewing a flat panel display in the prior art.
Figure 2:
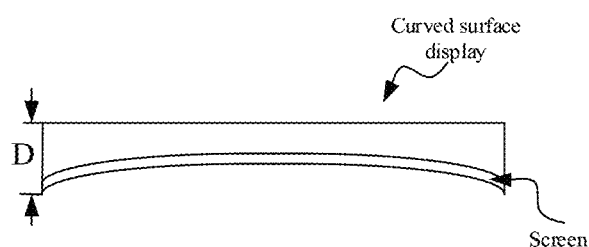
FIG. 2 is a structural schematic diagram of a curved surface display in the prior art.
Figure 3:
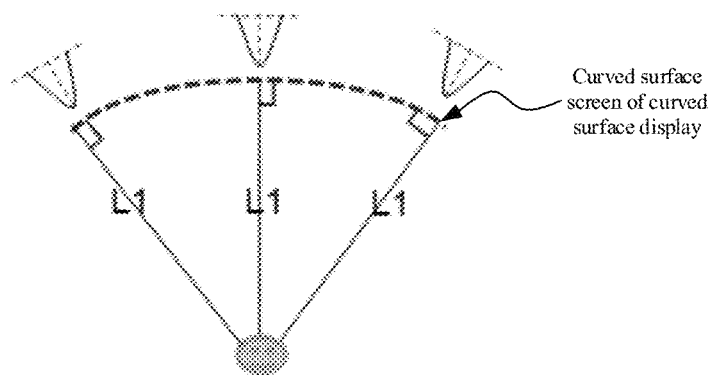
FIG. 3 is a schematic diagram of viewing the curved surface display in the prior art.

For example, in this embodiment, the light deflector 12 may be the liquid crystal lens. It can be seen from FIG. 2 that in the related art, a curved surface display has a curved surface screen, resulting in that a thickness of the curved surface display may be relatively large with respect to a thickness of the flat display. In the present application, the liquid crystal lens is used for implementing the function of light deflection, and the liquid crystal lens may be formed in a flat form, with a smaller thickness, which is advantageous for reducing an overall thickness of the display apparatus in this embodiment. In addition, the liquid crystal lens further has the characteristic of variable regulation degree for the light. For example, a voltage applied to an electrode in the liquid crystal lens is adjusted as necessary, that is, an electric field in the liquid crystal lens can be adjusted, so that the convex lens equivalent to the liquid crystal lens is variable. In this way, in practical application, it is possible to apply a corresponding voltage to the liquid crystal lens according to a position of the viewer so as to obtain the optimal viewing effect.

Figure 5A:
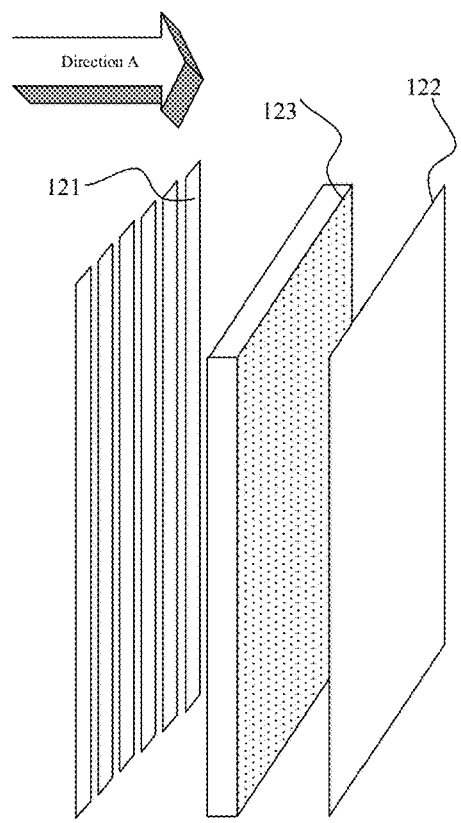
FIG. 5A is a stereoscopic structural schematic diagram of a liquid crystal lens provided by an embodiment of the present disclosure.
Figure 5B:
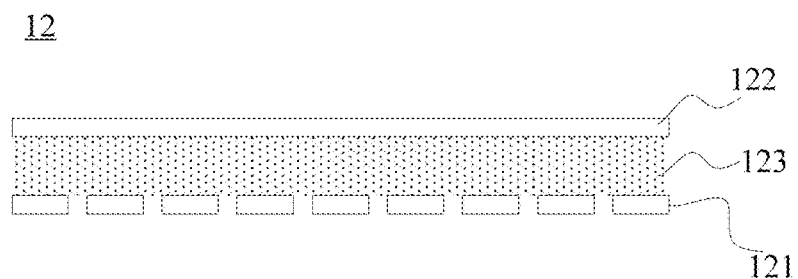
FIG. 5B is a side view I of a liquid crystal lens provided by an embodiment of the present disclosure.
Figure 5C:
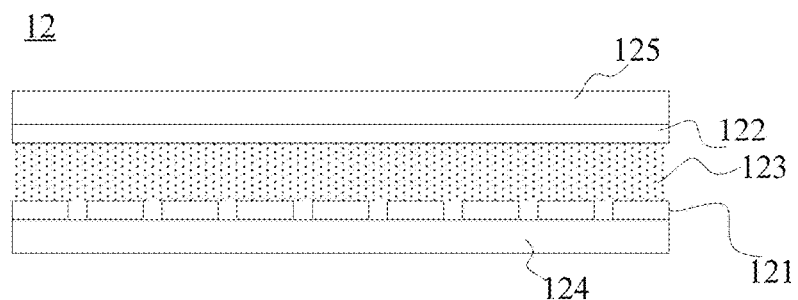
FIG. 5C is a side view II of the liquid crystal lens provided by the embodiment of the present disclosure.

With reference to FIG. 5A to FIG. 5C, the liquid crystal lens includes: a first electrode 121 and a second electrode 122 provided opposite to each other, and a liquid crystal layer 123 sandwiched between the two electrodes. The first electrode is a strip electrode arranged in parallel, and the strip electrode extends in a direction of the vertical center line 11c of the display panel, and the second electrode is a flat electrode. Positions of the first electrode and the second electrode can be exchanged.

In general, an electric field formed by the first electrode 121 and the second electrode 122 is gradually enhanced from a center to both sides, so that from incident light in the center to incident light at an edge, after the incident light passes through the liquid crystal lens, as illustrated in FIG. 4B, a deflection angle (a deflection angle of light emitted from the liquid crystal lens with respect to light incident on the liquid crystal lens, which is equal to an inclination angle hereinafter) of the light is gradually increased. In FIG. 4B, for light at the outmost edge, the deflection angle of the light is β; and in FIG. 6, for light at the outermost edge, the inclination angle is α, β=α.

Those skilled in the art should understand that the liquid crystal lens includes the liquid crystal layer, and thus, an enclosed space is required, and as illustrated in FIG. 5C, this enclosed space can be obtained by carrying out cell-assembling on two base substrates 124 and 125. Certainly, the enclosed space also can be formed by one base substrate and the display panel (not illustrated in the diagram).

In a design and production process, it should be determined according to actual needs which liquid crystal lens should be selected.

Figure 6:
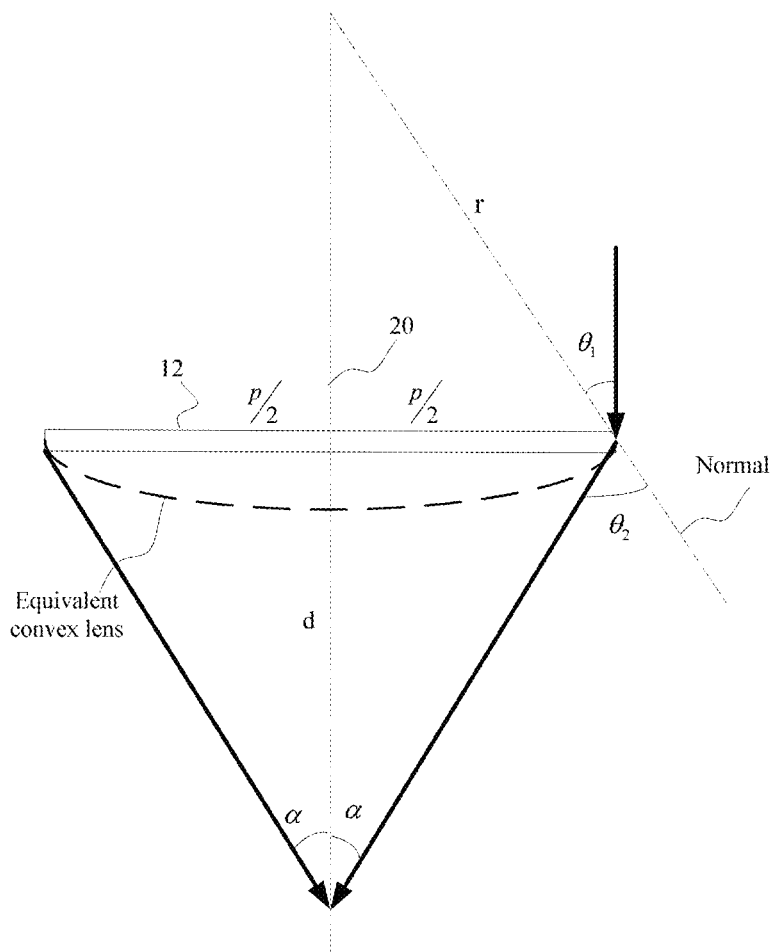
FIG. 6 is an optical path schematic diagram of an equivalent convex lens of the liquid crystal lens, which is provided by an embodiment of the present disclosure.

Firstly, with reference to FIG. 6, related parameters of the convex lens to which the liquid crystal lens is equivalent can be determined. By taking a 55-inch display panel as an example, a width of a long side of a screen is that p=1.2 m, and it is assumed that the viewer is positioned at a center position right ahead the display apparatus and a viewing distance is that m.

On this basis, an inclination angle α of light emitted by pixels at the position of the outermost edge of the screen to the viewer (the human eyes) at a center position can be calculated, and α is the maximum angle for the liquid crystal lens to deflect the incident light, thereby obtaining that tan α=p/2d=0.15.

Calculation is carried out by the incident light at the position of the outermost edge of the screen, an incident angle is denoted as $0_1$, and a refraction angle is denoted as $θ_2$, so that the following calculation formula can be obtained:

$$\begin{cases} θ_2 = θ_1 + α \\ n_1 * \sin θ_1 = n_2 * \sin θ_2 \\ \sin θ_1 = p/2r \end{cases}$$

Where, $n_1$ is a dielectric refractive index of the convex lens equivalent to the liquid crystal lens, for example, $n_1$=1.5; $n_2$ is a refractive index of the air, usually $n_2$=1.0; and r is a curvature radius of the convex lens equivalent to the liquid crystal lens.

Therefore, it can be obtained by calculation that r=2.14 m.

Further, a focal length of the convex lens equivalent to the liquid crystal lens may be calculated, which, of course, may be referred to as a focal length of the liquid crystal lens, denoted as f. With a focal length formula $f=(r*n_1)/(n_2-n_1)$, it can be obtained that f=4280 mm.

Then, according to a calculation formula: $f=(n_2*p^2)/(8Δn*d)$ which expresses corresponding relationship between the focal length and a retardation of the liquid crystal lens, it can be obtained that Δn*d=64.9 mm.

Further, corresponding liquid crystals can be selected according to actual requirements, a liquid crystal parameter Δn of the liquid crystal may be determined, and a cell thickness d of the liquid crystal lens may be calculated according to the above-described formula.

The above-described calculation method is only used as an example, and in practice, those skilled in the art can use an appropriate algorithm according to needs, to obtain relevant parameters of the liquid crystal lens, to further design, fabricate, or select a liquid crystal lens that meets requirements of these parameters.

The display apparatus provided by the embodiment of the present disclosure, comprises the display panel and the light deflector capable of converging light emitted from the display panel toward the direction of the center plane, so that, with reference to FIG. 4B, in a case where the display panel 11 needs not to be bent, the curved surface display effect is basically achieved by additionally providing the light deflector. Further, if light emitted from the display panel is vertical light, then the curved surface display effect is better. Since the display panel is a plane and does not need to be physically bent, it is possible to overcome a problem in the prior art of requirement for high bendability of a material and high difficulty to achieve the curved surface display in the process.

Embodiment Two

The embodiment of the present disclosure provides a display apparatus. A structure of a display panel is described emphatically, and the display panel can emit vertical light; with respect to a structure of a light deflector, Embodiment One may be referred to, which will not be repeated in this embodiment.

Figure 7:
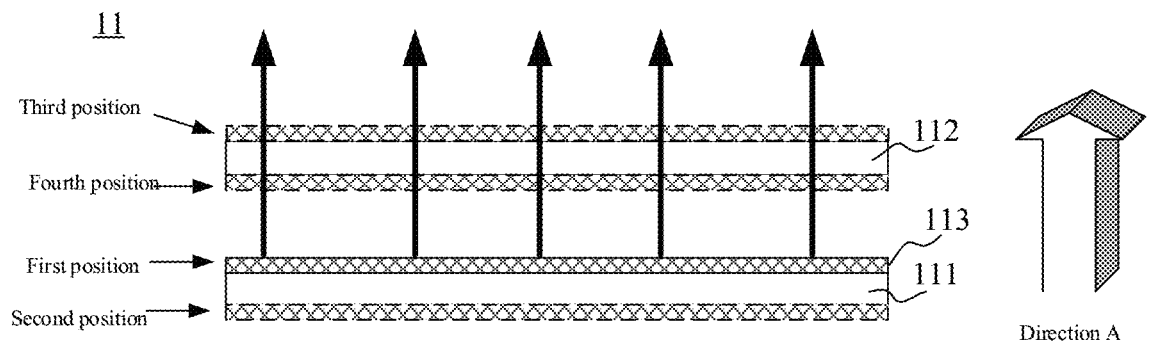
FIG. 7 is a position schematic diagram of a light correction portion in a display apparatus provided by an embodiment of the present disclosure.

As described in Embodiment One, there are various types of display panel 11. FIG. 7 may be referred to for whichever type of display panel, which includes: a first substrate 111 and a second substrate 112 provided opposite to and parallel to each other. A pixel structure (a portion between 112 and 111 in the diagram) which can implement display is usually provided between the two substrates, and in this embodiment, since the pixel structure is less related to an inventive point of the present disclosure, it is not described in detail. A material of the substrate may be transparent glass or the like. In order to clearly describe the solution, in this embodiment, it is limited that the second substrate 112 is close to the light deflector 12 with respect to the first substrate 111, that is to say, a substrate close to the light deflector 12 is referred to as the second substrate 112, and a substrate away from the light deflector 12 is referred to as the first substrate 111.

In order to enable the display panel to emit the vertical light, the display panel 11 further includes: a light correction portion 113, the light correction portion 113 being carried by the first substrate 111 or the second substrate 112. It should be noted that when the light correction portion 113 is carried by the first substrate 111, it indicates that the light correction portion 113 is formed on the first substrate 111, can be positioned on an inner side (a first position in the diagram) of the first substrate 111, or may be positioned on an outer side (a second position in the diagram) of the first substrate 11. Similarly, if the light correction portion 113 is carried by the second substrate 112, the light correction portion 113 can be positioned on an inner side (a fourth position in the diagram) of the second substrate 112 or on an outer side (a third position in the diagram) of the second substrate 112.

In FIG. 7, a case that the light correction portion 113 is arranged at the first position of the display panel is taken as an example, and other positions only represent positions to which the light correction portion 113 at the first position can be moved. In addition, the light correction portion 113 in the diagram is clung to a surface of the substrate, but in fact, other layers may be further provided between the light correction portion 113 and the substrate. For example, if the light correction portion 113 is provided at the third position, then an upper polarizer may further be provided between the second substrate 112 and the light correction portion 113; and of course, the light correction portion 113 may also be provided between the upper polarizer and the second substrate 112.

The light correction portion 113 is used for correcting incident light into emergent light perpendicular to the display panel. The incident light herein refers to light which is incident to the light correction portion 113, and the emergent light means light emerging from the light correction portion 113. If the light correction portion 113 is located at the first position in FIG. 7, then for a transmission direction of light emitted from the light correction portion 113, the diagram may be referred to. In this way, the display panel 11 may emit vertical light. Of course, since influence of the pixel structure on the transmission direction of light is relatively small, it can be ignored in this embodiment.

Hereinafter, different types of display panels will be introduced respectively.

Passive Display Panel

Firstly, the passive display panel is introduced. As is known to all, the type of display panel cannot emit light by itself, but it can depend on light emitted from a backlight module to implement display, so it may be referred to as the passive display panel.

In this embodiment, the passive display panel will be described in detail with a liquid crystal display panel as an example.

Figure 8:
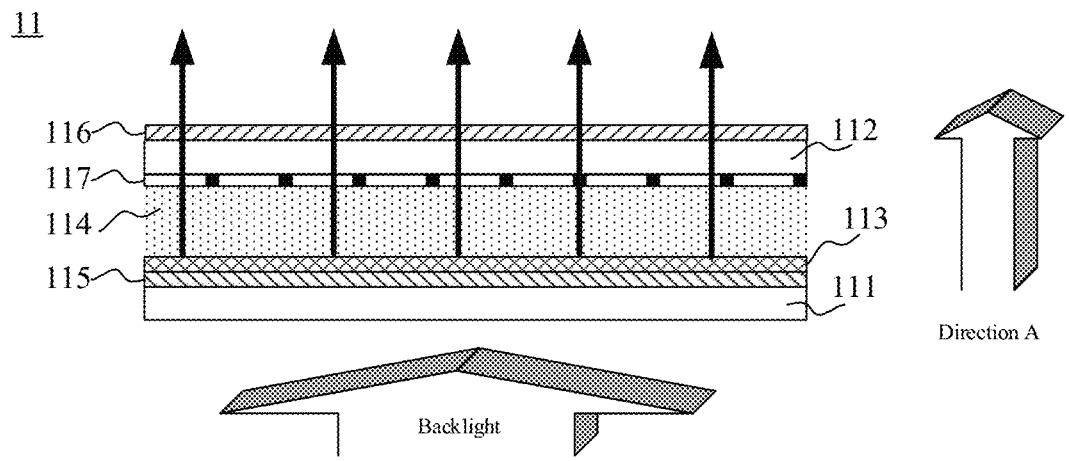
FIG. 8 is a schematic diagram of a liquid crystal display apparatus provided by an embodiment of the present disclosure.
Figure 9:
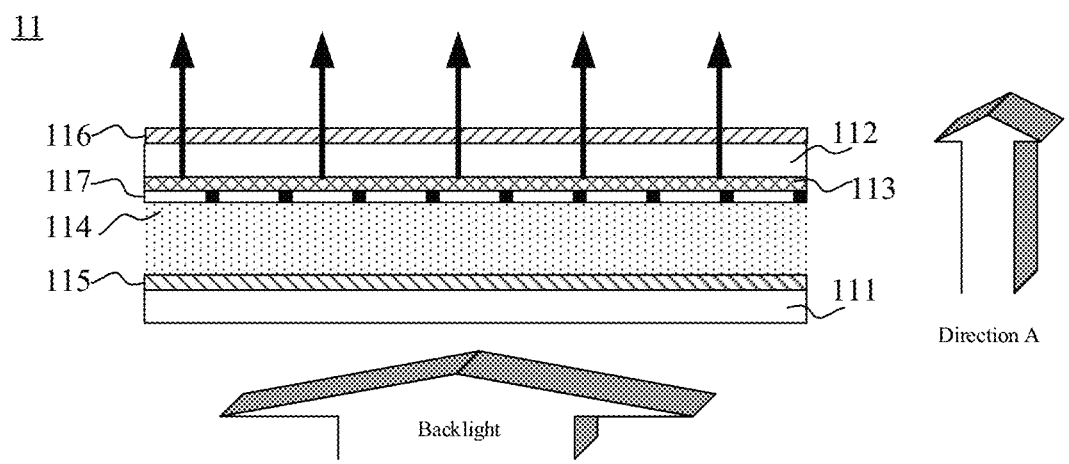
FIG. 9 is a schematic diagram of another liquid crystal display apparatus provided by an embodiment of the present disclosure.

As illustrated in FIG. 8 and FIG. 9, the display panel 11 includes: the first substrate 111 and the second substrate 112, and a liquid crystal layer 114 between the first substrate 111 and the second substrate 112. Because the liquid crystal display panel cannot emit light by itself, backlight needs to be provided by a backlight module. For a structure of the backlight module, the prior art may be referred to, and a conventional backlight module is usually unable to emit vertical light, so the display panel 11 according to this embodiment needs to correct the backlight emitted from the backlight module into vertical light.

Further, the display panel 11 further includes: a metal wire grid polarizer (WGP) 115 provided on the first substrate 111. Here, "on the first substrate 111" indicates a meaning of "carried by the first substrate 111", for example, the metal wire grid polarize 115 may be provided on an outer side of the first substrate 111, or may be provided inside the first substrate 111. The metal wire grid polarize 115 may be fabricated by using a nano-imprinting technology.

For most of liquid crystal display panels, a lower polarizer needs to be arranged on the outer side of the first substrate, and an upper polarizer needs to be arranged on an outer side of the second substrate, and thus, corresponding layer or component structures need to be arranged on both sides of the substrates and the substrates need to be overturned in the technical process so as to cause a complex process. In this embodiment, for example, as illustrated in FIG. 8 and FIG. 9, the display panel 11 further includes: a WGP 115 arranged on the inner side of the first substrate 111. The WGP 115 can replace the original lower polarizer, and at the moment, the upper polarizer 116 can be arranged on the outer side of the second substrate 112.

It should be noted that, it is satisfactory as long as the WGP is located between the first substrate 111 and the liquid crystal layer 114. For example, the WGP may be provided on an inner surface (also referred to as an upper surface) of the first substrate 111, so as to be in contact with the inner surface of the first substrate 111.

First Possible Implementation Mode

The display panel 11 is a common liquid crystal display panel, and namely includes an array substrate and a color filter substrate. The first substrate 111 may be used as a substrate of the array substrate, and the second substrate 112 is used as a substrate of the color filter substrate; of course, the first substrate 111 may also be used as the substrate of the color filter substrate, and the second substrate 112 as the substrate of the array substrate. In this embodiment, by taking the previous case as an example, at the moment, pixel electrodes arranged in an array, a signal line for applying a voltage to the pixel electrodes, a switching unit and the like are arranged on the first substrate 111, and further, the first substrate 111 further possibly includes a common electrode and the like (these elements or layer structures are not illustrated in the diagram, for which the prior art may be referred to); and a color filter layer, a black matrix and the like (these layers are not illustrated in the diagram, for which the prior art may be referred to) are arranged on the second substrate 112.

In order to correct light, the display panel 11 in this embodiment further includes a light correction portion 113. For example, the light correction portion 113 is provided between the first substrate 111 and the second substrate 112, that is, the light correction portion 113 is of an in cell structure.

As illustrated in FIG. 8, the light correction portion 113 is made on the inner side of the first substrate. For example, the light correction portion 113 can be arranged on a Thin Film Transistor (TFT) structure on the inner side of the first substrate 111, i.e., on the first substrate 111, the TFT structure is firstly made and then the light correction portion 113 is made; and the light correction portion 113 also can be arranged between the first substrate 111 and the TFT structure, i.e., the light correction portion 113 is firstly made on the first substrate 111, and then the TFT structure is made on the light correction portion 113.

As illustrated in FIG. 9, the light correction portion 113 also can be made on the inner side of the second substrate 112. At the moment, the light correction portion 113 can be made on a color filter, i.e., the color filter is firstly made on the second substrate 112, and then the light correction portion (not illustrated) is made on the color filter; and the light correction portion 113 also can be arranged between the second substrate 112 and the color filter 117, i.e., the light correction portion 113 is firstly made on the second substrate 112, and then the color filter 117 is made on the light correction portion 113.

In the embodiment of the present disclosure, the light correction portion 113 may have a size the same as that of the display panel, and at least correspond to a display region in the display panel (i.e., a region where light is emitted for display).

Figure 10:
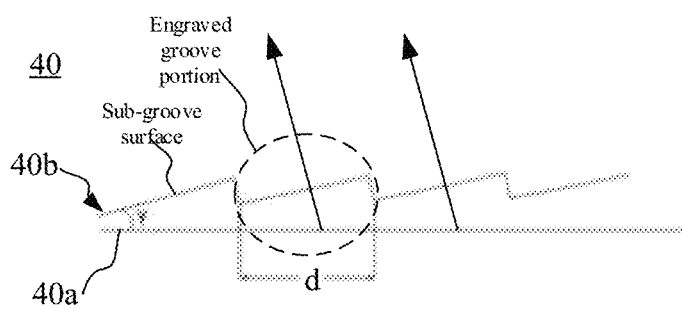
FIG. 10 is a schematic diagram of a diffraction grating provided by an embodiment of the present disclosure.

Hereinafter, a structure of the light correction portion 113 will be described in detail. In this embodiment, the light correction portion 113 may include a diffraction microstructure. The diffraction microstructure may be a diffraction grating 40 as illustrated in FIG. 10.

The diffraction grating 40 is made of a transparent material, is a transmissive diffraction grating, has a grating surface 40a and a groove surface 40b, and for example, may be a blazing grating, wherein the groove surface 40b is of a sawtooth shape, and an angle between the sawtooth-shaped groove surface 40b and the grating surface 40a is referred to as a blazing angle and is denoted as γ, and the blazed angle is generally an acute angle. As can be seen from the diagram, the diffraction grating 40 includes a plurality of engraved groove portions, and a width corresponding to each engraved groove portion is referred to as an engraving period and is denoted as d; d and γ of each engraved portion can be the same or can be different. In order to facilitate description, on the groove surface 40b, an adjacent surface (adopting the meaning of an adjacent side) of the blazing angle γ in two surfaces constituting one engraved portion is referred to as a sub-groove surface.

A light correction principle of the diffraction grating 40 is that: incident light is extracted based on diffraction of light, and if an incident direction and a wavelength of light which is incident to the diffraction grating 40 meet a certain condition, a beam with the wavelength can be subjected to blazing reinforced emergence at a specific angle. For example, if light incident on the groove surface 40b is perpendicular to the groove surface 40b, and meets 2d*sin γ=λ, a light beam with a wavelength λ is emitted, blazed and intensified, with a specific angle (perpendicular to the sub-groove surface of the groove surface 40b). Thus, by setting γ and d of each groove portion, the light incident on the diffraction grating 40 may be converted into parallel light rays with a predetermined wavelength emitted at a predetermined angle. Other incident light is emitted, without being intensified, that is, has weaker energy, and this part of light is not considered in this embodiment.

Based on this, by designing different d and γ, different light emergent angles and different light emergent wave bands may be obtained. Specifically, in this embodiment, the diffraction grating 40 has a selecting effect on the incident light, and can select out parallel beams perpendicular to the sub-groove surface to emit.

For example, if γ of respective groove portions are the same, and at this time, the respective sub-groove surfaces are parallel to each other, then the diffraction grating 40 may select a plurality of sets of parallel light beams, each set of parallel light beams are all perpendicular to the sub-groove surface, that is to say, when the respective sub-groove surfaces are parallel to each other, emergent light from the diffraction grating 40 is parallel light perpendicular to the entire groove surface 40b. At this time, d of different engraved portions can be set to make the light emergent wavebands different.

With the above-described principle, the light correction portion 113 is provided below by this embodiment.

Figure 11:
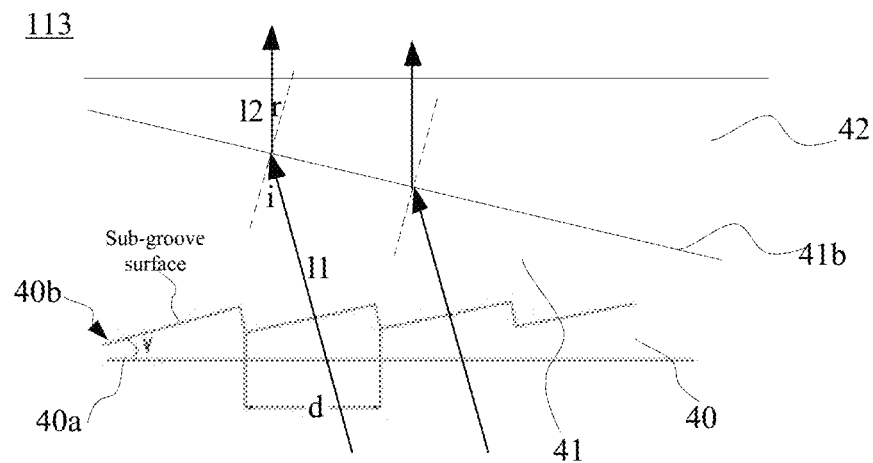
FIG. 11 is a schematic diagram I of a light correction portion provided by an embodiment of the present disclosure.

The light correction portion 113 provided by this embodiment, for which FIG. 11 may be referred to, includes: the diffraction grating 40 and a first dielectric layer 41.

The diffraction grating 40 has the grating surface 40a and the groove surface 40b, the groove surface 40b includes a plurality of sub-groove surfaces, and the respective sub-groove surfaces are arranged obliquely (the so-called "arranged obliquely" is arranged neither parallel to the display panel, nor perpendicular to the display panel), wherein the grating surface 40a is a light incident surface, and the groove surface 40b is a light emergent surface. In order to facilitate arrangement, in this embodiment, optically, the grating surface 40a is parallel to the display panel, and the sub-groove surface is necessarily oblique; and in combination with a working principle of the diffraction grating as described above, light emitted from the groove surface 40b may be perpendicular to the respective sub-groove surfaces, and then light emitted from the groove surface 40b is not perpendicular to the display panel, and therefore, it is still necessary to perform correction again with the first dielectric layer 41.

It should be noted that, in order that light beams emitted from the groove surface 40b are parallel to each other, preferably, the respective sub-groove surfaces of the groove surface 40b are arranged parallel to each other.

The first dielectric layer 41 is located on the groove surface 40b of the diffraction grating, and light emitted from the diffraction grating 40 is refracted by the light emergent surface 41b of the first dielectric layer, to be emergent light perpendicular to the display panel. According to the solution of the above-described example, light emitted from the diffraction grating 40 is parallel light perpendicular to the groove surface 40b, so that design of the light emergent surface 41b of the first dielectric layer may be simplified.

Figure 12:
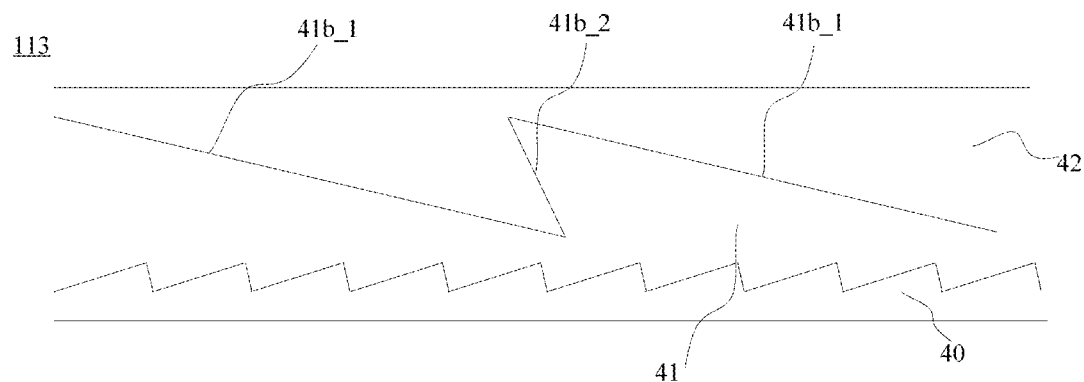
FIG. 12 is a schematic diagram II of the light correction portion provided by the embodiment of the present disclosure.

It should be noted that as illustrated in FIG. 11, the light emergent surface 41b of the first dielectric layer may be an inclined plane, and the inclined plane is usually flat. However, in this case, a thickness of a left end of the first dielectric layer 41 will still be relatively large. Thus, in this embodiment, for example, as illustrated in FIG. 12, the light emergent surface 41b of the first dielectric layer includes a plurality of parallel refractive sub-surfaces 41b_1, and as illustrated in the diagram, each refractive sub-surface is a flat inclined plane. The light emergent surface 41b further includes a connecting sub-surface 41b_2 which connects these refractive sub-surfaces 41b_1. The refractive sub-surface 41b_1 is used for refracting light emitted from the diffraction grating 40 into light perpendicular to the display panel; and besides taking a connecting effect, in order to avoid interference to the light, the connecting sub surfaces 41b_2 for example can be perpendicular to the sub-groove surfaces of the diffraction grating 40.

Light is refracted at an interface of the first dielectric layer 41 with other transparent dielectric (denoted as a dielectric W). With respect to the interface, a transmission direction of incident light 11 is known, and a transmission direction of refracted light 12 needs to meet a requirement of being perpendicular to the display panel, which, thus, is also known. Next, after a transparent material of the first dielectric layer 41 is selected, a refractive index n1 of the first dielectric layer 41 is known. In addition, if a position of the light correction portion 113 is designed, a refractive index n2 of the dielectric W is also known; for example, if the light correction portion 113 includes only two portions, i.e., the diffraction grating 40 and the first dielectric layer 41, and the first dielectric layer 41 is in direct contact with the liquid crystal layer, then n2 is a refractive index of the liquid crystal layer; and for another example, if the light correction portion 113 includes only two portions, i.e., the diffraction grating 40 and the first dielectric layer 41, and the light correction portion 113 is located on an outer side of the upper polarizer of the display panel, then n2 is a refractive index of the air. Based on the above-described known parameters, and in combination with a well-known refraction law, an interface (i.e., the light emergent surface 41b of the first dielectric layer) which meets the requirement may be designed; for example, an inclination direction and an inclination angle of the light emergent surface 41b of the first dielectric layer may be obtained.

For example, as illustrated in FIG. 11, in this embodiment, the sub-groove surface of the groove surface 40b is opposite to the light emergent surface 41b of the first medium layer in inclination direction. For example, the sub-groove surface has an inclination direction of which a left portion is low and a right portion is high, and the light emergent surface 41b of the first medium layer has an inclination direction of which a left portion is high and a right portion is low, which are beneficial to lighting and thinning of the light correction portion 113. According to an optical path diagram and the refraction law n1*sin i=n2*sin r, in this case, i is greater than r, and thus, n1<n2, that is to say, a refractive index of the dielectric W should be greater than a refractive index of the first dielectric layer 41.

Furthermore, preferably, as illustrated in FIG. 11 and FIG. 12, the light correction portion 113 further includes: a second dielectric layer 42, the second dielectric layer 42 being located on a light emergent surface of the first dielectric layer 41, and a light emergent surface of the second dielectric layer 42 being parallel to the display panel. Since light refracted from the light emergent surface of the first dielectric layer 41 has been perpendicular to the display panel, light is not refracted when passing through the emergent surface of the second dielectric layer 42, so that emergent light of the light correction portion 113 is perpendicular to the display panel.

Figure 13:
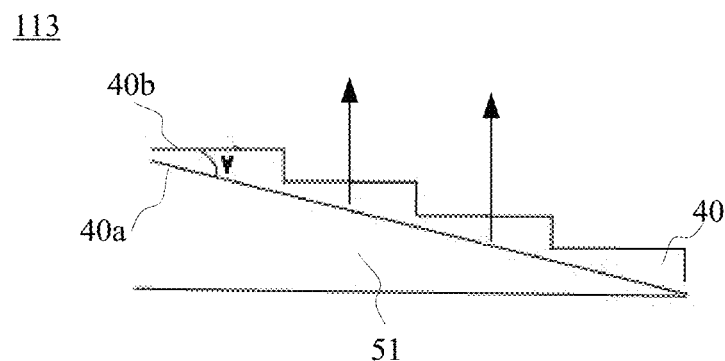
FIG. 13 is a schematic diagram III of the light correction portion provided by the embodiment of the present disclosure.

With reference to FIG. 13, this embodiment further provides another light correction portion 113, including: the diffraction grating 40, the diffraction grating 40 having the grating surface 40a and the groove surface 40b, the groove surface 40b including a plurality of sub-groove surfaces, and the sub-groove surface 40b being parallel to the display panel, wherein the grating surface 40a is a light incident surface, and the groove surface 40b is a light emergent surface. Based on a principle of the diffraction grating, emergent light from the diffraction grating 40 may be light with a specific wavelength which is perpendicular to the display panel.

If the light correction portion 113 includes only the diffraction grating 40, at this time the grating surface 40a of the diffraction grating 40 is in an oblique state, and at this time, it is not easy to provide the diffraction grating 40 in the display panel stably. Therefore, for example, the light correction portion 113 further includes: a first dielectric layer 51, the diffraction grating 40 being located on the first dielectric layer 51, and the grating surface 40a of the diffraction grating being bonded to the first dielectric layer 51. In this way, the first dielectric layer 51 plays a role in supporting the diffraction grating.

Figure 14:
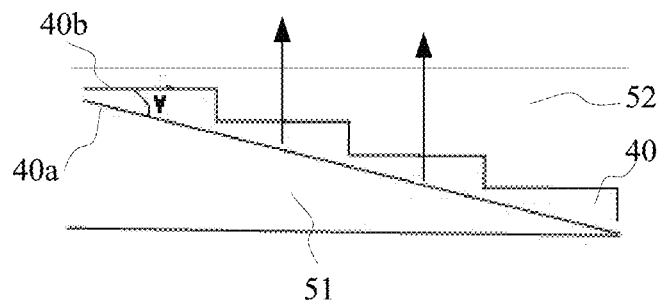
FIG. 14 is a schematic diagram IV of the light correction portion provided by the embodiment of the present disclosure.

Optionally, in order to further protect the groove surface 40b of the diffraction grating 40, as illustrated in FIG. 14, the light correction portion 113 may further include: a second dielectric layer 52, the second dielectric layer 52 being located on the groove surface 40b of the diffraction grating, and the light emergent surface of the second dielectric layer 52 being parallel to the display panel. In this way, the additionally provided second dielectric layer 52 will not change an original transmission direction of vertical light.

Figure 15:
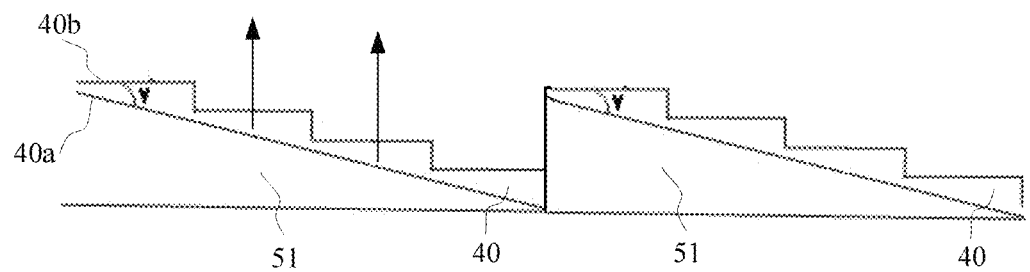
FIG. 15 is a schematic diagram V of the light correction portion provided by the embodiment of the present disclosure.

Further, in consideration of an overall thickness of the light correction portion 113, with reference to FIG. 15, there may be a plurality of diffraction gratings 40 and first dielectric layers 51 included, and each dielectric layer 51 and the diffraction grating 40 located thereon are arranged periodically in a direction along the display panel. Thus, the thickness of the light correction portion 113 may be reduced.

The above mainly describes the transmission direction of the light, and in the following, due to consideration to a case that the diffraction grating can generate a blazing reinforced emerging effect on the beam with the specific wavelength, in the embodiment, in consideration of color characteristics of a color display panel, the diffraction grating adaptive to the color characteristics can be designed.

Figure 16:
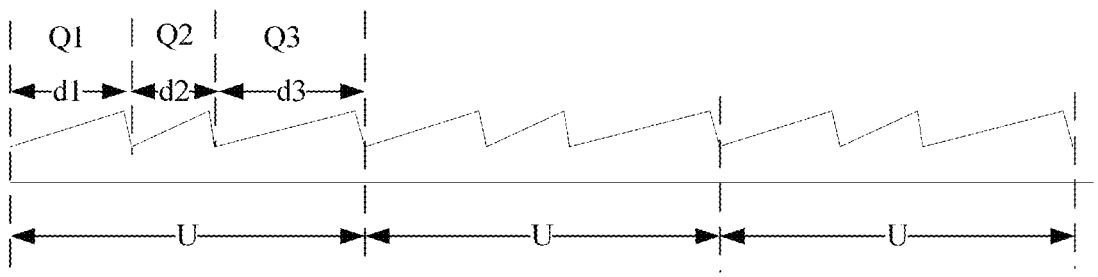
FIG. 16 is a schematic diagram II of the diffraction grating provided by the embodiment of the present disclosure.
Figure 17:
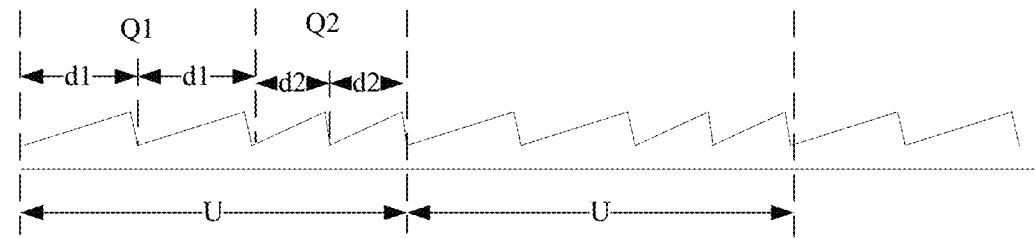
FIG. 17 is a schematic diagram III of the diffraction grating provided by the embodiment of the present disclosure.

For example, with reference to FIG. 16 and FIG. 17, the diffraction grating 40 includes engraved groove portions arranged periodically, the engraved groove portions in each period U include: engraved groove groups arranged sequentially, each engraved groove group includes the same number of engraved groove portions, the engraved groove portions in the same engraved groove group are the same in shape, and the engraved groove portions in different engraved groove groups are different in shape.

Exemplarily, as illustrated in FIG. 16, the engraved groove portions in each period U include three engraved groove groups Q1, Q2 and Q3 arranged sequentially, each engraved groove group includes one engraved groove portion, and the engraved groove portions in different engraved groove groups are different in shape. The shape of the groove portion is determined by d and γ of the groove portion; and in this embodiment, for example, all the engraved groove portions are the same in γ, that is, all the sub-groove surfaces are parallel to each other. Particularly in this example, an engraved groove width of the engraved groove portion in the engraved groove group Q1 is d1, an engraved groove width of the engraved groove portion in the engraved groove group Q2 is d2, and an engraved groove width of the engraved groove portion in the engraved groove group Q3 is d3; and d1, d2 and d3 are different from each other. As can be known from the working principle of the diffraction grating, wavelengths of light emitted, blazed and intensified, from the 3 sub-groove surface are different. Exemplarily, the groove width may be adjusted, so that the 3 sub-groove surfaces may emit, blazing, light with wave bands of three primary colors (wave bands of red, green, and blue). The light correction portion 113 including such diffraction grating 40, may be provided in a light emergent direction of the color filter, and for example, with reference to FIG. 9, may be provided between the color filter 117 and the second substrate 112.

Further exemplarily, as illustrated in FIG. 17, the engraved groove portions in each period U include two engraved groove groups Q1 and Q2 arranged sequentially, the engraved groove group Q1 includes two engraved groove portions which are of the same shape, and the engraved groove group Q2 includes two engraved groove portions which are of the same shape, wherein the engraved groove portions in the engraved groove group Q1 and the engraved groove portions in the engraved groove group Q2 are different in shape. Particularly in this example, an engraved groove width of the engraved groove portion in the engraved groove group Q1 is d1, an engraved groove width of the engraved groove portion in the engraved groove group Q2 is d2, and Bland d2 are all different. It can be known from the working principle of the diffraction grating that wavelengths capable of being subjected to blazing reinforced emergence by the two sub-groove surfaces are different. Exemplarily, by regulating the engraved groove widths, the two sub-groove surfaces can respectively carry out blazing emergence of wavebands (e.g., wavebands of blue light and yellow light) of two colors of light. The light correction portion 113 including such diffraction grating 40 can be arranged at a position of light before the light passes through the color filter, and with reference to FIG. 8, can be arranged on the first substrate 111. Common white light emitted from the backlight module is mixed light of blue light and yellow light, and with the type of diffraction grating 40, blue light and yellow light may be emitted, blazed, respectively, which, thus, will not affect a display characteristic of the display panel too much.

Second Possible Implementation Mode

In addition, the first substrate 111 may also be used as a substrate of a Color-filter on Array (COA) substrate, and the second substrate 112 is used as a substrate of a package substrate; and of course, the first substrate 111 may be used as the substrate of the package substrate, and the second substrate 112 may be used as the substrate of the COA substrate.

In such liquid crystal display panel, the light correction portion 113 may be additionally provided as well, and for a structure and a shape of the light correction portion 113, description of the ordinary liquid crystal display panel in the first implementation mode may be referred to, which will not be repeated here.

Self-Luminous Display Panel

In this embodiment, detailed description will be provided with an organic light-emitting diode (OLED) display panel as an example.

Figure 18:
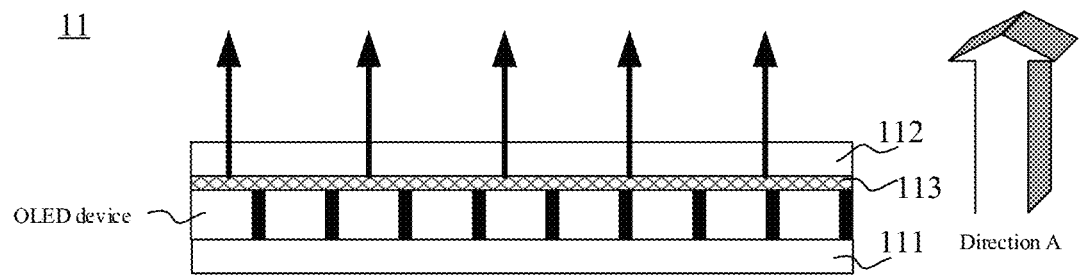
FIG. 18 is a schematic diagram of an active display apparatus provided by an embodiment of the present disclosure.

As illustrated in FIG. 18, the display panel 11 (the OLED display panel) includes: the first substrate 111 and the second substrate 112, and a plurality of OLED devices between the first substrate 111 and the second substrate 112, each OLED device being used as a smallest display unit in the display panel (which may be referred to as a pixel or a sub-pixel).

For such OLED display panel, if the OLED display panel is expected to emit vertical light, a light correction portion 113 can be additionally arranged in the OLED display panel. The OLED devices in the OLED display panels are light-emitting components, and thus, the light correction portion 113 should be arranged on a light emergent side of the OLED devices, so that light emitted by the OLED devices can be corrected into the vertical light by the light correction portion 113. For example, the light correction portion 113 is arranged between the OLED devices and the second substrate 112, i.e., an in-cell mode is adopted, so that the light correction portion can be protected. Further for example, the light correction portion 113 is positioned on an inner side surface (a lower surface in the drawing) of the second substrate 112, and is in contact with the inner side surface of the second substrate 112.

With respect to a structure and a shape of the light correction portion 113, description of the liquid crystal display panel in the first implementation mode may still be referred to, which will not be repeated here.

Embodiment Three

As mentioned in Embodiment Two, the passive display panel cannot emit light by itself, and needs to implement display by the light emitted by the backlight module. In Embodiment Two, the light correction portion is additionally provided in the existing passive display panel, so that light incident in the passive display panel is corrected into vertical light, and is emitted from the passive display panel.

In this embodiment, a new idea is provided for a problem how to enable the vertical light to emerge from the passive display panel. Namely, without changing the structure of the original passive display panel, the light correction portion is additionally arranged in the original backlight module to enable the backlight module to emit the vertical light, and at the moment, influence of the passive display panel on the transmission direction of the light is ignored, so that the vertical light emerges from the passive display panel.

Figure 19:
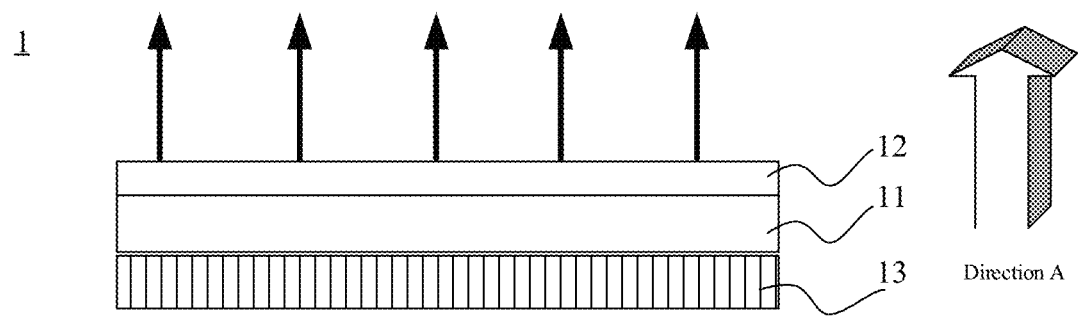
FIG. 19 is a schematic diagram of another display apparatus provided by an embodiment of the present disclosure.

With reference to FIG. 19, this embodiment provides a display apparatus, comprising: a display panel 11, a light deflector 12 and a backlight module 13.

The display panel 11 is a passive display panel, which, exemplarily, may be a liquid crystal display panel. The display panel may be a display panel in the prior art, and of course, may also be the display panel as mentioned in Embodiment Two, so that the display panel can take a secondary correction effect.

For the light deflector 12, description in Embodiment One may be referred to, which will not be repeated here.

The backlight module 13 includes: a light source and a light correction portion located in a light emergent direction of the light source, and the light correction portion being used for correcting incident light into emergent light perpendicular to the display panel. For the light correction portion, description in Embodiment Two may be referred to, which will not be repeated here.

The backlight module 13 may be of a direct-lit type, and the backlight module of the direct-lit type includes a light source, a diffusion plate and an optical sheet group located in a light emergent direction of the diffusion plate. In this embodiment, the light correction portion may be provided between the diffusion plate and the optical sheet group, and may also be provided in a light emergent direction of the optical sheet group.

Figure 20:
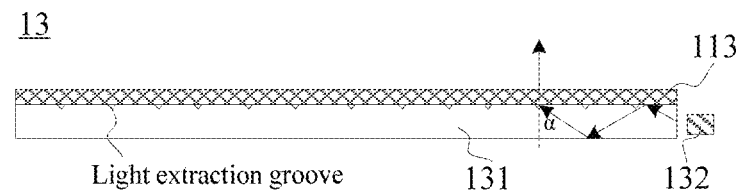
FIG. 20 is a structural schematic diagram of a backlight module in the display apparatus illustrated in FIG. 19.

For example, as illustrated in FIG. 20, the backlight module 13 may also be of an edge-lit type, and the backlight module of the edge-lit type further includes: a light guide plate 131, a light source 132 being located on a side surface of the light guide plate 131, and the light correction portion 113 being located in a light emergent direction of the light guide plate 131.

Exemplarily, the light source 132 may be a monochromatic light source and for example, may be a blue chip, and at this time, blue light may enter the light guide plate 131. In this case, all groove portions of a diffraction grating in the light correction portion 113 have a same shape, for emitting a wave band of blue light, and of course, preferably, blue light is made to be emitted perpendicular to a groove surface of the diffraction grating.

Further, the light guide plate 131 has a light extract groove on a surface close to the light correction portion 113. When meeting total reflection conditions, the light emitted by the light source 132 can be totally reflected in the light guide plate 131. Moreover, among light that is totally reflected, light with a specific incident angle α may be emitted from the light extract groove, and enters the light correction portion 113. The so-called specific incident angle α is set according to actual needs, for example, the angle may be obtained by calculation according to an optical theory, to ensure that light can be incident perpendicular to the sub-groove surface of the diffraction grating. In this way, selection can be carried out for once before the light enters the light correction portion 113, and verticality of the light when the light emerges from the light correction portion 113 can be further ensured.

Of course, the backlight module of the edge-lit type may further include: an optical sheet group (not illustrated) or the like located in the light emergent direction of the light guide plate 131. In this embodiment, the light correction portion 113 may be provided between the light guide plate and the optical sheet group, and may also be provided in the light emergent direction of the optical sheet group, and the former is preferred.

In addition, such structure in which the light guide plate 131 and the light correction portion 113 are combined may also be provided inside the display panel, and at this time, it is necessary to provide the light source on a side surface of the light guide plate 131.

According to the display apparatus provided by the embodiments of the present disclosure, by additionally arranging the light correction portion in the backlight module, the backlight module can emit the vertical light, and the vertical light still is the vertical light after passing through the display panel, so that the curved surface display effect is achieved by the light deflector.

It should be noted that the display apparatus provided by each embodiment of the present disclosure may be any product with a display function, e.g., a television, a notebook computer, a digital photo frame, a mobile phone, a tablet personal computer, a navigator and the like, and may also be a part with the display function, e.g., a display and the like.

The foregoing is merely exemplary embodiments of the invention, but is not used to limit the protection scope of the invention. The protection scope of the invention shall be defined by the attached claims.

The application claims priority to the Chinese patent application No. 201610222194.9, filed Apr. 11, 2016, the entire disclosure of which is incorporated herein by reference as part of the present application.

The invention claimed is:

1. A display apparatus, comprising:
a flat display panel;
a light deflector, the light deflector being located in a light emergent direction of the display panel, the light deflector being configured to converge light emitted from the display panel in a direction toward a center plane, the center plane being perpendicular to the display panel, and a vertical center line of the display panel being located in the center plane,
wherein, the display panel includes:
a first substrate and a second substrate provided opposite to and parallel to each other, the second substrate being closer to the light deflector with respect to the first substrate;
a light correction portion, the light correction portion being carried by the first substrate or the second substrate, and the light correction portion being configured to change a direction of incident light to correct the incident light into emergent light perpendicular to the display panel wherein, the light correction portion includes:
a diffraction grating, the diffraction grating having a grating surface and a groove surface, the groove surface including a plurality of sub-groove surfaces, and the respective sub-groove surfaces being provided obliquely, the grating surface being a light incident surface, and the groove surface being a light emergent surface;
a first dielectric layer, the first dielectric layer being located on the groove surface of the diffraction grating, and light emitted from the diffraction grating being refracted by the light emergent surface of the first dielectric layer, changed into emergent light perpendicular to the display panel.

2. The display apparatus according to claim 1, wherein, the light correction portion further includes: a second dielectric layer, the second dielectric layer being located on the light emergent surface of the first dielectric layer, and a light emergent surface of the second dielectric layer being parallel to the display panel.

3. The display apparatus according to claim 1, wherein, the respective sub-groove surfaces are arranged in parallel, and the light emergent surface of the first dielectric layer is one inclined plane or includes a plurality of parallel refractive subsurfaces.

4. The display apparatus according to claim 3, wherein, the sub-groove surface and the light emergent surface of the first dielectric layer are inclined towards opposite directions.

5. The display apparatus according to claim 1, wherein, the diffraction grating includes groove portions arranged periodically, the groove portion within each period including: groove groups arranged sequentially, the numbers of groove portions included in the respective groove groups being the same, shapes of groove portions within a same groove group being the same, and shapes of groove portions in different groove groups being different.

* * * * *